(12) United States Patent
Chang

(10) Patent No.: US 11,502,020 B2
(45) Date of Patent: Nov. 15, 2022

(54) ELECTRONIC DEVICE HAVING A CHIP PACKAGE MODULE

(71) Applicant: Tong Hsing Electronic Industries, Ltd., Taipei (TW)

(72) Inventor: Chia-Shuai Chang, Taipei (TW)

(73) Assignee: TONG HSING ELECTRONIC INDUSTRIES, LTD., Taipei (TW)

(*) Notice: Subject to any disclaimer, the term of this patent is extended or adjusted under 35 U.S.C. 154(b) by 0 days.

(21) Appl. No.: 17/039,641

(22) Filed: Sep. 30, 2020

(65) Prior Publication Data

US 2021/0134702 A1 May 6, 2021

(30) Foreign Application Priority Data

Oct. 31, 2019 (TW) .................. 108139495

(51) Int. Cl.
| | |
|---|---|
| *H01L 23/433* | (2006.01) |
| *H01L 25/18* | (2006.01) |
| *H01L 23/31* | (2006.01) |
| *H01L 23/498* | (2006.01) |
| *H01L 23/00* | (2006.01) |
| *H01L 27/146* | (2006.01) |

(52) U.S. Cl.
CPC ...... *H01L 23/4334* (2013.01); *H01L 23/3107* (2013.01); *H01L 23/49861* (2013.01); *H01L 24/29* (2013.01); *H01L 24/32* (2013.01); *H01L 25/18* (2013.01); *H01L 27/14634* (2013.01); *H01L 2224/29139* (2013.01); *H01L 2224/32245* (2013.01)

(58) Field of Classification Search
None
See application file for complete search history.

(56) References Cited

U.S. PATENT DOCUMENTS

| | | | | |
|---|---|---|---|---|
| 6,118,177 A | * | 9/2000 | Lischner | H01L 23/36 257/706 |
| 2005/0056928 A1 | * | 3/2005 | Kwon | H01L 23/36 257/E23.101 |
| 2006/0055432 A1 | * | 3/2006 | Shimokawa | H01L 21/565 257/E23.125 |
| 2006/0186551 A1 | * | 8/2006 | Lange | H01L 23/3107 257/778 |
| 2014/0239479 A1 | * | 8/2014 | Start | H01L 23/3121 257/706 |
| 2020/0211938 A1 | * | 7/2020 | Park | H01L 23/13 |

* cited by examiner

*Primary Examiner* — Michelle Mandala
*Assistant Examiner* — Jordan M Klein
(74) *Attorney, Agent, or Firm* — Li & Cai Intellectual Property Office

(57) ABSTRACT

An electronic device includes a chip package module which includes a chip carrier substrate, a chip, a thermal conductive unit, and an encapsulant layer. The chip is electrically connected to the chip carrier substrate. The thermal conductive unit has a first thermal conductive surface connected to the chip, and a second thermal conductive surface opposite to the first thermal conductive surface. The thermal conductive unit has a thermal conductivity greater than that of the chip. The encapsulant layer covers the chip and partially covers the thermal conductive unit in such a manner that the second thermal conductive surface is exposed from the encapsulant layer.

14 Claims, 1 Drawing Sheet

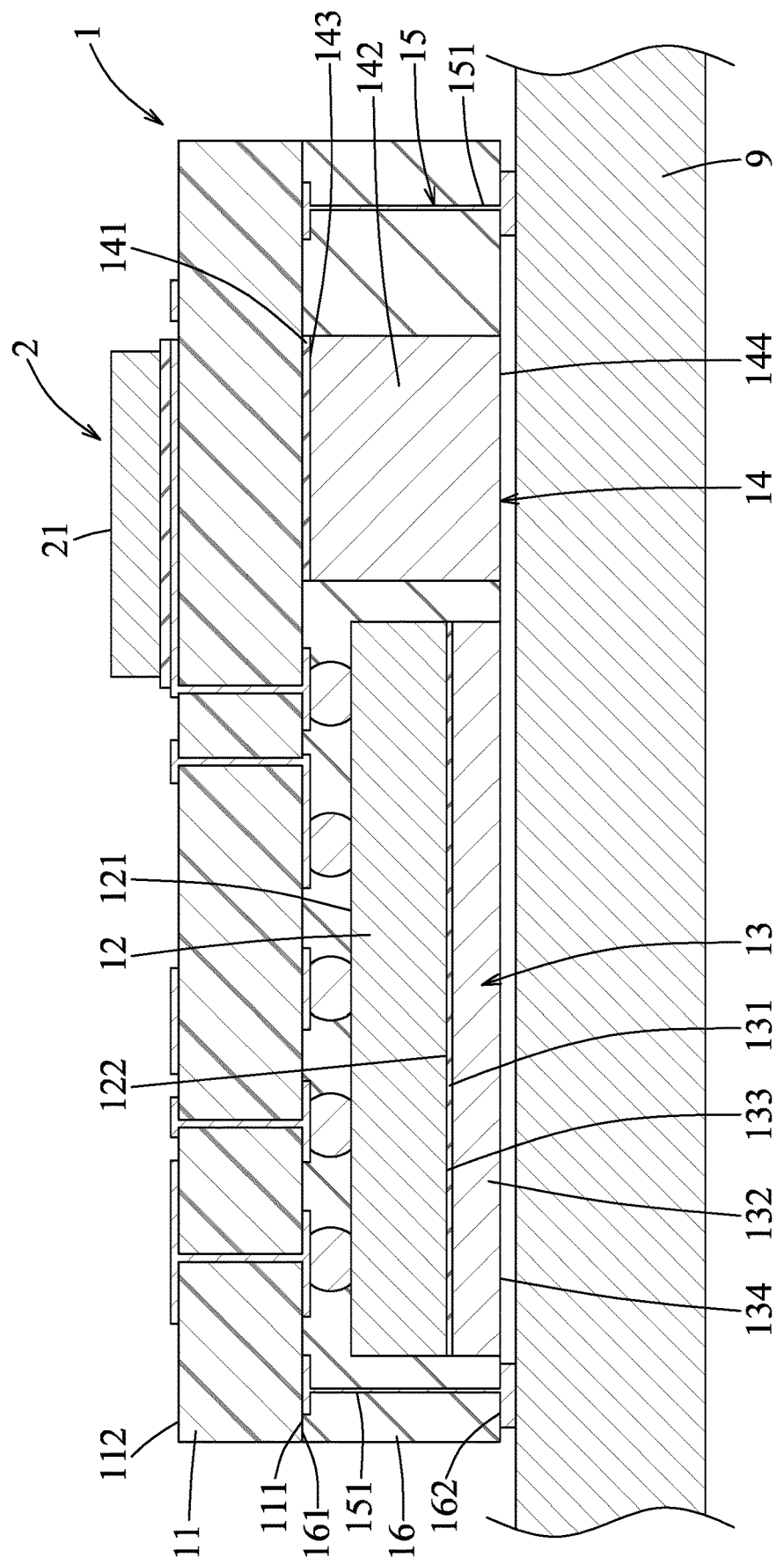

ELECTRONIC DEVICE HAVING A CHIP PACKAGE MODULE

CROSS-REFERENCE TO RELATED APPLICATION

This application claims priority of Taiwanese Invention Patent Application No. 108139495, filed on Oct. 31, 2019.

FIELD

The disclosure relates to an electronic device, more particularly to an electronic device having a chip package module.

BACKGROUND

As electronic devices become lighter, thinner, shorter, smaller, etc., and are being developed for increased versatility and higher performance, the sizes of electronic components or chip package modules thereof have been miniaturized to range between the micrometer scale ($10^{-6}$ meters) and the millimeter scale ($10^{-3}$ meters). For a system-in-package device which includes a chip and an electronic component, as the size thereof gets smaller, an increased amount of heat is generated by the chip and the electronic component while performing a high power computing process. Moreover, the small size system-in-package device results in limited heat dissipation surface and hence causes retention of the heat generated by the chip and the electronic component within the system-in-package device, thereby affecting the operational efficiency of the system-in-package device.

SUMMARY

Therefore, the object of the disclosure is to provide an electronic device that can alleviate at least one of the drawbacks of the prior art.

According to the disclosure, an electronic device includes a chip package module which includes a chip carrier substrate, a chip, a thermal conductive unit, and an encapsulant layer.

The chip carrier substrate has a first circuit surface and a second circuit surface opposite to the first circuit surface.

The chip is electrically connected to the first circuit surface and has a first chip surface facing the first circuit surface, and a second chip surface opposite to the first chip surface of the chip.

The thermal conductive unit has a first thermal conductive surface connected to the second chip surface, and a second thermal conductive surface opposite to the first thermal conductive surface. The thermal conductive unit has a thermal conductivity greater than that of the chip.

The encapsulant layer covers the chip and partially covers the thermal conductive unit in such a manner that the second thermal conductive surface is exposed from the encapsulant layer.

BRIEF DESCRIPTION OF THE DRAWINGS

Other features and advantages of the disclosure will become apparent in the following detailed description of the embodiment with reference to the accompanying drawings, of which:

FIG. 1 is a sectional schematic view of an embodiment of an electronic device according to the disclosure.

DETAILED DESCRIPTION

Referring to FIG. an embodiment of an electronic device according to the disclosure includes a chip package module 1, an electronic element 2, and a circuit board 9. In some embodiments, the chip package module 1 may be a system level packaging structure. The chip package module 1 and the electronic element 2 may be of micrometer scale. In this embodiment, the chip package module 1 and the electronic element constitute, for example, an optical module for 3-D image identification.

The chip package module 1 includes a chip carrier substrate 11, a chip 12, a thermal conductive unit 13, a thermal dissipating unit 14, a lead frame 15, and an encapsulant layer 16.

The chip carrier substrate 11 has a first circuit surface 111 and a second circuit surface 112 opposite to the first circuit surface 111. In this embodiment, the first circuit surface 111 is electrically connected to the circuit board 9. In this embodiment, the electronic element 2 is disposed on the second circuit surface 112 of the chip carrier substrate 11. The chip carrier substrate 11 exemplified herein is a double-sided substrate. That is, both the first and second circuit surfaces 111, 112 are formed with conductive circuits for electrical connection with electronic components. This configuration allows efficient utilization of both surfaces of the chip carrier substrate 11 and hence reduces the area of the chip carrier substrate 11 and the overall volume of the electronic device. In this embodiment, the chip carrier substrate 11 is spaced apart from the circuit board 9, and the first circuit surface 111 faces the circuit board 9. The chip 12 and the thermal conductive unit 13 are disposed between the first circuit surface 111 and the circuit board 9. The chip carrier substrate 11 is made of a ceramic material such as aluminum nitride or aluminum oxide. Moreover, the second circuit surface 112 of the chip carrier substrate 11 has a relatively large surface area capable of contacting air for heat dissipation. As the ceramic material typically has high thermal conductivity, and with a relatively large surface area for heat dissipation, the chip carrier substrate 11 is able to quickly absorb and dissipate heat generated in the electronic device.

The chip 12 is electrically connected to the first circuit surface 111. In this embodiment, the chip 12 as exemplified is a flip chip for controlling the electronic element 2. The chip 12 has a first chip surface 121 facing and electrically connecting the first circuit surface 111, and a second chip surface 122 opposite to the first chip surface 121 of the chip 12 and facing the circuit board 9.

The thermal conductive unit 13 has a thermal conductivity greater than that of the chip 12. The thermal conductive unit 13 has a first thermal conductive surface 133 connected to the second chip surface 122, and a second thermal conductive surface 134 opposite to the first thermal conductive surface 133. Specifically, the thermal conductive unit 13 includes a thermal conductive member 132 that has the second thermal conductive surface 134, and a thermal conductive adhesive 131 that is connected to the thermal conductive member 132 and that has the first thermal conductive surface 133.

The thermal conductive adhesive 131 is a metal-containing adhesive, e.g., silver glue or solder/tin paste. In this embodiment, the thermal conductive adhesive 131 is a silver glue and the thermal conductivity of the silver glue is greater than 30 W/mk. The thermal conductive adhesive 131 is directly connected between the thermal conductive member 132 and the second chip surface 122 of the chip 12. In particular, the conductive adhesive 131 is applied to the entire second chip surface 122 of the chip 12 to completely covers the second chip surface 122 in such a manner that no part of the second chip surface 122 is exposed and no air is trapped between the thermal conductive adhesive 131 and the second chip surface 122. The thermal conductive member 132 is thereby adhered to the chip 12 through the thermal conductive adhesive 131.

In this embodiment, the thermal conductive member 132 as exemplified is a metal layer made of copper and completely covers a surface of the thermal conductive adhesive 131 opposite to the chip 12. Heat is transferred from the chip 12 through the thermal conductive adhesive 131 to the thermal conductive member 132. Hence, negative effects of heat to the chip 12 are reduced and the chip 12 can function normally. In this embodiment, the second thermal conductive surface 134 is a flat surface and is spaced apart from the circuit board 9 so that air flowing therebetween may aid heat dissipation. In other embodiments, the second thermal conductive surface 134 may be directly connected to thermal conductive structures (not shown) of the circuit board 9 through the flat surface to increase heat dissipation efficiency.

The thermal dissipating unit 14 is mounted to the first circuit surface 111, and has a thermal conductivity greater than that of the chip carrier substrate 11. The thermal dissipating unit 14 has a first thermal dissipating surface 143 connected to the first circuit surface 111, and a second thermal dissipating surface 144 opposite to the first thermal dissipating surface 143. Specifically, the thermal dissipating unit 14 includes a thermal dissipating member 142 that is partially exposed from the encapsulant layer 16 and that has the second thermal dissipating surface 144, and a thermal dissipating adhesive 141 that is connected between the thermal dissipating member 142 and the first circuit surface 111 and that has the first thermal dissipating surface 143.

The thermal dissipating adhesive 141 is a metal-containing adhesive, for example, silver glue or solder paste. In this embodiment, the thermal dissipating adhesive 141 is a silver glue and covers a portion of the first circuit surface 111 spaced apart from the chip 12. The thermal dissipating member 142 is adhered to the first circuit surface 111 through the thermal dissipating adhesive 141.

In this embodiment, the thermal dissipating member 142 is a metallic block made of copper and completely covers a surface of the thermal dissipating adhesive 141 which is opposite to the chip carrier substrate 11. As such, the thermal dissipating adhesive 141 can absorb heat from the chip carrier substrate 11 and transfer it to the thermal dissipating member 142 to reduces the effect of the heat on the electronic components disposed on the chip carrier substrate 11 and to thereby maintain operational efficiency of said electronic components. The materials of the thermal conductive member 13 and the thermal dissipating member 14 may be varied depending on requirements and are not limited to what is described above. It should be noted that the second thermal dissipating surface 144 is also a flat surface, and may be spaced apart from the circuit board 9 so that air flowing therebetween may aid heat dissipation, or may be directly connected to the thermal conductive structures (not shown) of the circuit board 9 through the flat surface to increase heat dissipation efficiency.

The lead frame 15 has a plurality of leads 151 extending between the chip carrier substrate 11 and the circuit board 9. Specifically, each of the leads 151 has two opposite ends respectively and electrically connected to the first circuit surface 111 of the chip carrier substrate 11 and the circuit board 9.

In this embodiment, the encapsulant layer 16 includes epoxy resin. Through a molding process, the encapsulant layer 16 is formed to cover the first circuit surface 111 and the chip 12 to partially embed therein and partially cover the thermal conductive unit 13, the thermal dissipating unit 14, and the lead frame 15 in such a manner that the second thermal conductive surface 134, the second thermal dissipating surface 144 and portions of the leads 151 for electrically connecting the circuit board 9 are exposed from the encapsulant layer 16. The encapsulant layer 16 protects and secures portions of the chip 12, the thermal conductive unit 13, the thermal dissipating unit 14 and the lead frame 15. The encapsulant layer 16 has a contacting surface 161 which is directly connected to the first circuit surface 111, and a non-contact surface 162 which is opposite to the contacting surface 161 and which is either coplanar to or slightly indented from the second thermal conductive surface 134. When the chip package module 1 is electrically connected to the circuit board 9 via the leads 151, there is a gap between the circuit board 9, and the second thermal conductive surface 134 and the second thermal dissipating surface 144, so that air may flow through the gap to come into contact with the second thermal conductive surface 134 and the second thermal dissipating surface 144.

The electronic element 2 is electrically connected to the second circuit surface 112 and is controlled by the chip 12. In this embodiment, the electronic element 2 is an optical component, and an area of the chip carrier substrate 11 occupied by the electronic element 2 on the second circuit surface 112 and an area of the chip carrier substrate 11 occupied by the thermal dissipating unit 14 on the first circuit surface 111 are situated on a same part of the chip carrier substrate 11. Through this configuration, the heat generated by the electronic element 2 may be transferred to the thermal dissipating unit 14 through the shortest route so as to maintain optimal operational efficiency. That is to say, the area of the chip carrier substrate 11 occupied by the electronic element 2 on the second circuit surface 112 extends over a part or the whole of the area of the chip carrier substrate 11 occupied by the thermal dissipating unit 14 on the first circuit surface 111 so that most of the heat is directly dissipated by the thermal dissipating unit 14.

In a variation of the embodiment, the electronic element 2 is omitted. This variation allows the users to design on their own different configurations using different electronic elements.

In sum, by providing the thermal conductive member 132 on the chip 12 and sealing the thermal conductive member 132 with the encapsulant layer 16 to secure and protect the thermal conductive member 132, the first thermal conductive member 132 is able to absorb and dissipate heat generated by the chip 12 to improve the operational efficiency of the chip 12. Moreover, by virtue of the particular arrangement of the positions of the thermal dissipating unit 14 and the electronic element 2 on the chip carrier substrate 11, the heat generated by the electronic element 2 is transferred via the shortest path to the thermal dissipating unit 14. Therefore, residual heat from the electronic element 2 and the chip carrier substrate 11 can be reduced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An electronic device comprising a chip package module which includes:
    a chip carrier substrate having a first circuit surface and a second circuit surface that is opposite to said first circuit surface;
    a chip electrically connected to said first circuit surface and having a first chip surface that faces said first circuit surface, and a second chip surface that is opposite to said first chip surface of said chip;
    a thermal conductive unit having a first thermal conductive surface that is connected to said second chip surface, and a second thermal conductive surface that is opposite to said first thermal conductive surface, said thermal conductive unit having a thermal conductivity greater than that of said chip;
    a thermal dissipating unit mounted to said first circuit surface, and having a thermal conductivity greater than that of said chip carrier substrate;
    an encapsulant layer formed on said first circuit surface and having a non-contact surface that is arranged away from said chip carrier substrate, wherein said chip, said thermal conductive unit, and said thermal dissipating unit are embedded in said encapsulant layer, and said second thermal conductive surface of said thermal conductive unit and an end surface of said thermal dissipating unit are exposed from said non-contact surface of said encapsulant layer; and
    a plurality of leads each having an embedded part and a connection part that integrally extends from said embedded part, wherein said embedded part of each of said leads is connected to said first circuit surface and is embedded in said encapsulant layer, and said connection part of each of said leads protrudes from said non-contact surface.

2. The electronic device as claimed in claim 1, wherein said thermal conductive unit includes a thermal conductive member that has said second thermal conductive surface, and a thermal conductive adhesive that is connected to said thermal conductive member and that has said first thermal conductive surface.

3. The electronic device as claimed in claim 2, wherein said second thermal conductive surface is a flat surface that is coplanar with said non-contact surface and said end surface of said thermal dissipating unit.

4. The electronic device as claimed in claim 2, wherein said thermal conductive adhesive is directly connected between said thermal conductive member and said second chip surface of said chip, and completely covers said second chip surface of said chip.

5. The electronic device as claimed in claim 2, wherein said thermal conductive member includes copper, and said thermal conductive adhesive includes silver.

6. The electronic device as claimed in claim 5, wherein said thermal conductive adhesive has a thermal conductivity greater than 30 W/mK.

7. The electronic device as claimed in claim 1, wherein said thermal dissipating unit includes a thermal dissipating member that has said end surface exposed from said encapsulant layer, and a thermal dissipating adhesive that is connected between said thermal dissipating member and said first circuit surface.

8. The electronic device as claimed in claim 7, wherein said thermal dissipating member includes copper, and said thermal dissipating adhesive includes silver.

9. The electronic device as claimed in claim 1, further comprising a circuit board connected to said connection parts of the leads so as to be electrically connected to said first circuit surface.

10. The electronic device as claimed in claim 9, wherein said second thermal conductive surface and said circuit board are spaced apart from each other through said connection parts of the leads for allowing air to travel therebetween, and wherein said chip and said thermal conductive unit are disposed between said first circuit surface and said circuit board.

11. The electronic device as claimed in claim 1, wherein said chip and said thermal dissipating unit are spaced apart from each other along said first circuit surface of said chip carrier surface.

12. The electronic device as claimed in claim 1, further comprising an electronic element electrically connected to said second circuit surface, wherein said electronic element on said second circuit surface and said thermal dissipating unit on said first circuit surface are situated on a same part of said chip carrier substrate, and said encapsulant layer partially covers said thermal dissipating unit.

13. An electronic device comprising a chip package module which includes:
    a chip carrier substrate having a first circuit surface and a second circuit surface that is opposite to said first circuit surface;
    a chip electrically connected to said first circuit surface and having a first chip surface that faces said first circuit surface, and a second chip surface that is opposite to said first chip surface of said chip;
    a thermal conductive unit having a first thermal conductive surface that is connected to said second chip surface, and a second thermal conductive surface that is opposite to said first thermal conductive surface, said thermal conductive unit having a thermal conductivity greater than that of said chip;
    an encapsulant layer formed on said first circuit surface and having a non-contact surface that is arranged away from said chip carrier substrate, wherein said chip and said thermal conductive unit are embedded in said encapsulant layer, and said second thermal conductive surface of said thermal conductive unit is exposed from said non-contact surface of said encapsulant layer; and
    a plurality of leads each having an embedded part and a connection part that integrally extends from said embedded part, wherein said embedded part of each of said leads is connected to said first circuit surface and is embedded in said encapsulant layer, and said connection part of each of said leads protrudes from said non-contact surface.

14. An electronic device comprising:

a chip package module which includes:
- a chip carrier substrate having a first circuit surface and a second circuit surface that is opposite to said first circuit surface;
- a chip electrically connected to said first circuit surface and having a first chip surface that faces said first circuit surface, and a second chip surface that is opposite to said first chip surface of said chip;
- a thermal conductive unit having a first thermal conductive surface that is connected to said second chip surface, and a second thermal conductive surface that is opposite to said first thermal conductive surface, said thermal conductive unit having a thermal conductivity greater than that of said chip;
- an encapsulant layer formed on said first circuit surface and having a non-contact surface that is arranged away from said chip carrier substrate, wherein said chip and said thermal conductive unit are embedded in said encapsulant layer, and said second thermal conductive surface of said thermal conductive unit is exposed from said non-contact surface of said encapsulant layer; and
- a plurality of leads each having an embedded part and a connection part that integrally extends from said embedded part, wherein said embedded part of each of said leads is connected to said first circuit surface and is embedded in said encapsulant layer, and said connection part of each of said leads protrudes from said non-contact surface;

a circuit board that is connected to said connection part of each of said leads so as to be electrically connected to said chip carrier substrate; and an electronic element, wherein said electronic element and said circuit board are respectively located at two opposite sides of said chip package module, and said electronic element is electrically and structurally connected to said second circuit surface of said chip package module.

\* \* \* \* \*